United States Patent [19]

Madrid

[11] Patent Number: 4,785,167
[45] Date of Patent: Nov. 15, 1988

[54] PHOTODETECTOR HAVING CASCADED PHOTOELEMENTS

[75] Inventor: Benny A. Madrid, Albuquerque, N. Mex.

[73] Assignee: International Business Machines Corporation, Armonk, N.Y.

[21] Appl. No.: 90,198

[22] Filed: Aug. 26, 1987

[51] Int. Cl.[4] .............................................. H01J 40/14
[52] U.S. Cl. ................................. 250/214 A; 330/258; 369/46
[58] Field of Search ....................... 330/258, 59, 308; 369/44, 46; 250/214 A, 214 C, 578, 211 J, 210; 307/311; 357/47

[56] References Cited

U.S. PATENT DOCUMENTS

| 1,877,279 | 9/1932 | Dawson | 369/46 |
| 3,315,176 | 4/1967 | Biard | 330/258 |
| 4,066,973 | 1/1978 | McNally | 330/59 |
| 4,446,545 | 5/1984 | Van Dijk | 369/44 |
| 4,563,760 | 1/1986 | Maeda et al. | 369/44 |
| 4,566,088 | 1/1986 | Yoshida et al. | 369/44 |
| 4,578,786 | 3/1986 | McIntosh et al. | 369/44 |
| 4,580,255 | 4/1986 | Inoue et al. | 369/44 |
| 4,581,728 | 4/1986 | Nakamura et al. | 369/46 |
| 4,589,102 | 5/1986 | Volleau et al. | 369/46 |
| 4,659,930 | 4/1987 | Johnson et al. | 250/214 C |
| 4,695,989 | 9/1987 | Kimoto | 369/44 |

FOREIGN PATENT DOCUMENTS

| 0012417 | 1/1980 | Japan | 250/214 C |
| 0059223 | 3/1986 | Japan | 250/214 C |

Primary Examiner—David C. Nelms
Assistant Examiner—Michael Messinger
Attorney, Agent, or Firm—H. F. Somermeyer

[57] ABSTRACT

A photodetection system includes first and second photodetectors, each having an anode and a cathode. The anode of one of the photodetectors is ohmically connected to the cathode of the other photodetectors. The photodetectors are suitably electrically biased and disposed for receiving one or two light beams. Output circuit means are electrically connected to the anode and cathode junction between the two photodiodes for providing an output electrical signal having low or no common mode noise. A preferred embodiment of the invention using a single semiconductor chip for the entire circuit arrangement is also illustrated.

6 Claims, 1 Drawing Sheet

PHOTODETECTOR HAVING CASCADED PHOTOELEMENTS

FIELD OF THE INVENTION

The present invention relates to photodetection means, particularly photodetection means which reduces common mode noise in output signals.

DISCUSSION OF THE PRIOR ART

In magnetooptic recorders, the readback signals from record media contain phase-rotated light polarizations representative of the recorded information. Such reflections contain so-called "P" and "S" components. The P and S components are typically separated for determining the polarization rotation. Other forms of optical processing may be employed for separating the rotated-reflected polarized light so that the light may be directed to one of two photodetectors. The photodetectors in turn are respectively electrically connected to transimpedance amplifiers or operational amplifiers which in turn are connected to a differential amplifier. The differential amplifier supplies a signal representative of the difference in optical intensities impinging upon the respective photodetectors for indicating which direction the reflected light from the magnetooptic medium has had its polarization rotated. The requirement of separate transimpedance amplifiers for the respective photoconductors results in electrical signal noise induced into the readback signal. Further, four connections are required for the photodetectors. Two for the respective transimpedance amplifiers and two for the electrical signal bias. A problem also arises in that the transimpedance amplifiers interposed between the respective photodetectors and the inputs to the differential amplifier are not always equal. As a result, common mode noise is induced into the readback signal by the transimpedance amplifiers. Accordingly, it is desired to replace the electrical connections such that the common mode noise can be more efficiently handled without requiring extensive electrical feedback connections.

Typically, a pair of photodetectors are connected to a differential amplifier either directly or through transimpedance amplifiers. For example, U.S. Pat. No. 4,589,102 shows photodetectors 10 and 12 connected to differential amplifier 19. The anodes of the photodiodes 10 and 12 are connected to the inputs of the amplifier. In a similar manner, in U.S. Pat. No. 4,580,255 in FIGS. 14 and 16, a pair of photodiodes 4-2 and 4-3 are respectively coupled to a differential amplifier 4-4 through intervening operation amplifier 21 and 22. This circuit arrangement is typical in a magnetooptic recorder, even though the U.S. Pat. No. 4,580,255 is not directed to that end. FIG. 4 of U.S. Pat. No. 4,566,088 shows two independent connections to amplifiers 120 and 120 in its FIG. 4. Again, the separate electrical connections are subject to common mode noise insertion. Also U.S. Pat. No. 4,446,545 shows three photodetectors 10 through 12 (FIG. 1) with the photodetector 11 and 12 being individually connected to separate inputs of circuit means which analyze the relative light intensities of the two photodetectors. See FIG. 6 of this patent. Again, common mode noise is possibly inserted by the electrical circuit means shown in this patent. U.S. Pat. No. 4,581,728 shows two photodiodes 33 and 31 receiving light from an optical system. The electrical connections from the two diodes are through transimpedance amplifiers 41 and 42 eventually to differential amplifier 50. Again, common mode noise can be introduced into such a circuit arrangement.

U.S. Pat. No. 4,578,786 is cited for its showing of the photodiodes in FIG. 8 which are respectively connected to differential amplifiers 220 and 222 for feeding into differential amplifier 226. Again, common mode noise is possible with this arrangement.

U.S. Pat. No. 4,563,760 is cited for its showing in FIG. 8 which shows diodes D1 and D2, not photodiodes, for providing filtering action in an electrical circuit. There is no function of cancellation of common mode noise in this particular circuit arrangement.

SUMMARY OF THE INVENTION

It is an object of the invention to provide electrical apparatus of the photodetection type which can reduce or eliminate common mode noise. In accordance with the invention, first and second photodetectors each having an anode and a cathode have the cathode of one of the photodetectors connected to the anode of the second photodetector. The other connections to the photodetectors are for biasing the operation of the photodetectors. Output circuit means has an input electrically connected to the anode of the first photodetector and the cathode of the second photodetector for supplying an output signal having minimal common mode noise. It is preferred that the photodetectors have identical electrical and physical properties for minimizing common mode noise. It is also preferred that the photodetectors be of the diode type.

In another aspect of the invention, the photodetector is formed on a single, semiconductor chip with an isolation zone between the photodetectors and circuit means used to process output signals based upon the photo-induced operation of the two photodetectors. In one embodiment, the isolation zone is about five mils such that an isolated region containing the two photodetectors is physically separated from the isolated region containing the amplifiers.

The circuits and arrangements of the present invention are most advantageously employed in an optical signal recorder and playback system.

The foregoing and other objects, features, and advantages of the invention will be apparent from the following more particular description of preferred embodiments of the invention, as illustrated in the accompanying drawings.

DETAILED DESCRIPTION

Figure 1:
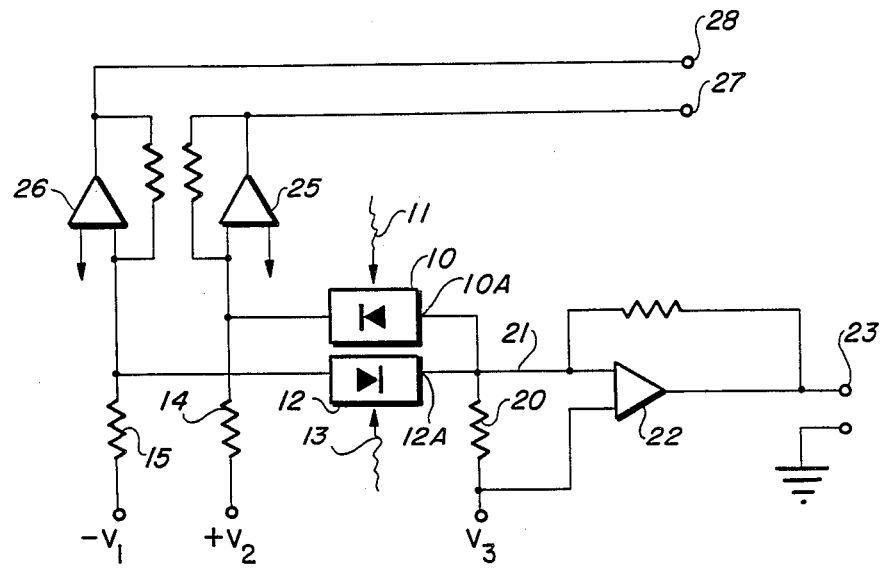
FIG. 1 is a simplified circuit schematic showing the operation of the present invention.

Referring now more particularly to the drawings, like numerals indicate like parts and structural features in the three figures. In FIG. 1, a pair of photodetectors 10 and 12, shown as photodiodes, are arranged to respectively receive light beams 11 and 13. Photodiodes 10 and 12 may be, and preferably are, formed on a single semiconductor chip such that the electrical and physical properties of the two photodiodes are as closely together as possible. It is to be understood that phototransistors and other photodetection elements may be readily substituted for the photodiodes 10 and 12. The terms "anode" and "cathode" as used with respect to the photodiodes 10 and 12 for phototransistors respectively refer to the collector and emitter, as well as to comparable element portions of other photo-elements which may be successfully employed in the FIG. 1 illustrated circuit. The anode 10A and the cathode 12A respectively of photodiodes 10 and 12 are ohmically connected together as by a low-impedance electrical lead. This electrical connection provides a signal output connection of the two photodiodes 10 and 12. The second connection is to a reference potential as is known for electrical circuits. The cathode portion of photodiode 10 is connected to a first electrical bias source 14 connected to a bias potential $+V2$. The anode of photodiode 12 is ohmically-electrically connected to bias source 15 which in turn is connected to biased voltage $-V1$. In this situation, the photodiodes 10 and 12 are reversed biased with the impinging light beams 11 and 13 causing the electrical current conduction in the circuit formed between the photodiodes and the electrical bias circuits.

The anode 10A and cathode 12A are suitably coupled to a bias circuit 20 which has a bias voltage V3. Electrical lead 21 is an input portion of output circuit means 22 which comprises a typical transimpedance amplifier for converting the electrical current flowing between the photodiodes 10 and 12 to an electrical voltage signal at output terminal 23. Characteristic of the electrical signal is the complete elimination of common mode noise when the photodiodes 10 and 12 are electrically and physically identical, preferably on a single semiconductor chip.

The signal on output terminal 23 is representative of a difference signal of light intensities respectively impinging upon photodetectors 10 and 12. Accordingly, the circuit arrangement is a simple substitution for the prior art which required two transimpedance amplifiers to be electrically interposed respectively between two photodetectors and a differential amplifier. Hence, the function is performed with two less amplifier circuits and fewer connections to be made in either a semiconductor chip or a circuit board. Electrical noise is reduced in that a single transimpedance amplifier constituting output circuit means 22 replaces the concatenated connection of a transimpedance amplifier with a differential amplifier in the prior art. Such elimination of circuit means results in a signal-to-noise improvement of about 3 db (decibels).

The individual light intensities in impinging upon photodetectors 10 and 12 can also be measured from the FIG. 1 illustrated circuit. A pair of operational transimpedance amplifiers 25, 26 are respectively connected to the cathode of the first photodetector diode 10 and the anode of the second photodetector diode 12. The two operational amplifiers 25, 26 respectively supply the output electrical signals to terminals 27 and 28 which may be used for indicating tracking error signals in optical disk recorders whereas terminal 23 may be used for indicating either focus errors or for indicating data, depending upon the optical and physical arrangements of the optical data recorder player in which the circuit is used. The electrical bias circuit means 14 and 15 may be incorporated into the amplifiers 25,26 rather than being separate as shown in FIG. 1.

Figure 2:
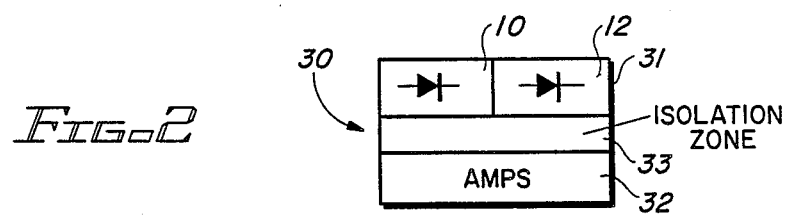
FIG. 2 is a diagrammatic showing of a single semiconductor chip incorporating the FIG. 1-illustrated circuit.
Figure 3:
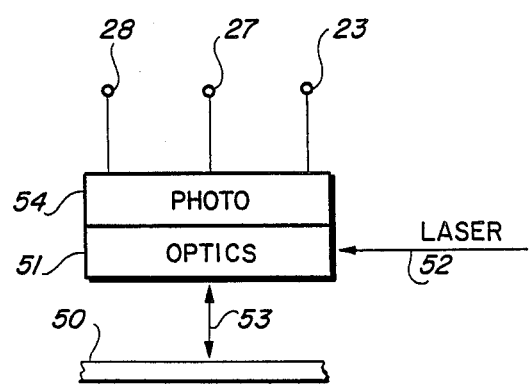
FIG. 3 is a greatly simplified showing of an optical recorder capable of using the FIG. 1-illustrated circuit arrangement.

FIG. 2 illustrates a single chip embodiment of the FIG. 1 photodetection system. Placing all of the circuit components on a single chip reduces cost, makes a smaller photodetection circuit and thereby allows a smaller photodetection head to be constructed such as shown in FIG. 3. The chip 30 includes two isolated semiconductor regions 31 and 32 which are separated about five mils (0.005 inches) by isolation zone 33. The photodiodes 10 and 12 are suitably formed within the first isolated region 31 whereas the amplifiers 22, 25 and 26 are suitably formed in the second isolation region 32. Suitable electrical connections can be made on the semiconductor chip 30 using known technology and following the circuit arrangement shown in FIG. 1.

FIG. 3 is an extremely simplified drawing of an optical disk readback system which includes a magnetooptic or other optical medium 50 being scanned by an optic system 51 of known design, and hence not detailed. A laser supplies light over light path 52 to optics 51 which in turn directs the received laser light beam to medium 50 via two-way light path 53. The light reflected from optical medium 50 traverses path 53 into optics 51. Optics 51 in a known manner direct the reflected light to the photo section 54 which includes photodiodes 11 and 12 and the semiconductor circuits comprising the electrical connections of FIG. 1 and the amplifiers 22, 25 and 26. Photo section 54 is preferably bonded and optically secured to the optics 51 which in turn constitute a plurality of optical prisms and the like suitably bonded together, using known techniques. Output terminals 23, 27 and 28 lead from photo section 54 to detection and control circuits, as is known in the art. While the invention has been particularly shown and described with reference to preferred embodiments thereof, it will be understood by those skilled in the art that various changes in form and details may be made therein without departing from the spirit and scope of the invention.

What is claimed is:

1. In a photodetection circuit having low common mode signal, the combination of:
   first and second identical photodetectors each having an anode means and a cathode means with the anode means of the first photodetector being ohmically coupled to the cathode means of the second photodetector;
   output circuit means electrically coupled to said anode means of the first photodetector and the cathode means of the second photodetector and an output means carrying a signal with no common mode noise; and
   first and second individual output means respectively-electrically coupled to the cathode means of the first photodetector and the anode means of the second photodetector with the first and second individual output means not having said inherent common mode rejection.

2. Electrical apparatus for detecting light beams to be intercepted by first and second photodetectors, each said photodetector having an anode and a cathode;
   the improvement including, in combination:
   the anode of the first photodetector being electrically ohmically connected to the cathode of the second photodetector;
   first and second electrical bias means, said electrical bias means respectively supplying relatively positive and negative electrical bias;

the cathode of the first photodetector being electrically-ohmically connected to said first electrical bias means;

the anode of the second photodetector being electrically-ohmically connected to the said second electrical bias means;

output circuit means having an input electrically connected to anode of the first photodetector and the cathode of the second photodetector;

said first and second electrical bias means being individual operational amplifiers, each having an input and an output connection, said input connections of the operational amplifiers being respectively electrically-ohmically connected to the cathode of the first photodetector and the anode of the second photodetector; and both said operational amplifiers supplying output signals respectively representative of light impinging on said first and second photodetectors.

3. The electrical apparatus set forth in claim 2, wherein said photodetectors both are closely juxtaposed;

means for intercepting a small cross-section light beam having intensity modulations carrying information and means for splitting the light beam into two beams and for directing the two light beams to the photodetectors, respectively; and data detection means electrically coupled to said output circuit means for detecting the carried information.

4. The electrical apparatus set forth in claim 2, further including, a semiconductor chip, first and second isolated regions in the chip, said photodetectors being in said first isolated region and the output circuit means being in said second isolated region.

5. The electrical apparatus set forth in claim 4, wherein said first and second isolated regions have a physical separation on the chip of about five thousandths of one inch.

6. Electrical apparatus for detecting light beams to be intercepted by first and second photodetectors, each said photodetector having an anode and a cathode;

the improvement including, in combination:

the anode of the first photodetector being electrically ohmically connected to the cathode of the second photodetector;

first and second electrical bias means, said electrical bias means respectively supplying relatively positive and negative electrical bias;

the cathode of the first photodetector being electrically-ohmically connected to said first electrical bias means;

the anode of the second photodetector being electrically-ohmically connected to the said second electrical bias means;

output circuit means having an input electrically connected to anode of the first photodetector and the cathode of the second photodetector;

a semiconductor chip having first and second isolated regions with said first and second isolated regions having a physical separation on the chip of at least about five thousandths of one inch; and said first and second photodetectors be in any first of said isolated regions and said electrical bias means and output circuit means being in said second isolated region.

* * * * *